(12) United States Patent
Yamamoto

(10) Patent No.: US 10,660,227 B2
(45) Date of Patent: May 19, 2020

(54) ELECTRONIC MODULE AND METHOD OF MANUFACTURING ELECTRONIC MODULE

(71) Applicant: Murata Manufacturing Co., Ltd., Kyoto (JP)

(72) Inventor: Issei Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/428,162

(22) Filed: May 31, 2019

(65) Prior Publication Data

US 2019/0289737 A1  Sep. 19, 2019

Related U.S. Application Data

(63) Continuation of application No. PCT/JP2017/043780, filed on Dec. 6, 2017.

(30) Foreign Application Priority Data

Dec. 15, 2016 (JP) .................. 2016-243794

(51) Int. Cl.
  *H05K 5/06*  (2006.01)
  *H05K 1/02*  (2006.01)
  (Continued)

(52) U.S. Cl.
  CPC ............. *H05K 5/065* (2013.01); *H01L 23/28* (2013.01); *H01L 25/04* (2013.01); *H01L 25/18* (2013.01);
  (Continued)

(58) Field of Classification Search
  CPC ...... H05K 9/0022; H05K 5/065; H05K 1/181; H05K 2201/10522; H05K 2201/10545;
  (Continued)

(56) References Cited

U.S. PATENT DOCUMENTS 10,219,383 B2 * 2/2019 Kitagawa ............... H05K 1/183
2008/0247704 A1 * 10/2008 Kodama .............. G02B 6/4204
385/14

(Continued)

FOREIGN PATENT DOCUMENTS

JP         5454681 B2    3/2014
WO    2009/037833 A1    3/2009
(Continued)

OTHER PUBLICATIONS

International Search Report for International Application No. PCT/JP2017/043780, dated Feb. 27, 2018.

(Continued)

*Primary Examiner* — Daniel P Wicklund
*Assistant Examiner* — Sagar Shrestha
(74) *Attorney, Agent, or Firm* — Pearne & Gordon LLP

(57) ABSTRACT

An electronic module includes a substrate having a first main surface and a second main surface, first electronic components on the first main surface, second electronic components on the second main surface, a first sealing resin portion, and a second sealing resin portion. Through holes are formed so as to extend through the substrate and the first sealing resin portion. A third electronic component is placed in the through holes. An area between the through holes and the third electronic component is filled with the second sealing resin portion, and the second sealing resin portion is formed to be exposed at a surface of the first sealing resin portion. When viewed in a direction perpendicular to the first main surface, the second sealing resin portion surrounds the third electronic component. The first sealing resin portion and the second sealing resin portion are made of different types of resins.

16 Claims, 10 Drawing Sheets

(51) Int. Cl.
    *H05K 1/18* (2006.01)
    *H05K 3/28* (2006.01)
    *H05K 3/34* (2006.01)
    *H05K 5/02* (2006.01)
    *H05K 9/00* (2006.01)
    *H05K 3/46* (2006.01)
    *H01L 25/18* (2006.01)
    *H01L 23/28* (2006.01)
    *H01L 25/04* (2014.01)

(52) U.S. Cl.
    CPC ......... *H05K 1/0266* (2013.01); *H05K 1/0271* (2013.01); *H05K 1/18* (2013.01); *H05K 1/181* (2013.01); *H05K 1/186* (2013.01); *H05K 3/284* (2013.01); *H05K 3/3436* (2013.01); *H05K 3/46* (2013.01); *H05K 5/0247* (2013.01); *H05K 9/0022* (2013.01); *H05K 2201/09936* (2013.01); *H05K 2201/10545* (2013.01); *H05K 2201/10719* (2013.01); *H05K 2203/107* (2013.01); *H05K 2203/1316* (2013.01); *H05K 2203/1327* (2013.01)

(58) Field of Classification Search
    CPC . H01L 23/552; H01L 23/3121; H01L 23/538; H01L 25/16
    USPC ................................ 361/760, 800, 816, 818
    See application file for complete search history.

(56) References Cited

U.S. PATENT DOCUMENTS

| | | | | |
|---|---|---|---|---|
| 2009/0016671 | A1* | 1/2009 | Asai | ........................ G02B 6/43 385/14 |
| 2013/0077262 | A1* | 3/2013 | Yamamoto | ........... H05K 3/4697 361/739 |
| 2013/0300002 | A1 | 11/2013 | Yokoyama et al. | |
| 2014/0085843 | A1* | 3/2014 | Otsubo | ................... H01L 23/13 361/760 |
| 2015/0131231 | A1* | 5/2015 | Yoo | ..................... H05K 3/4007 361/707 |
| 2016/0293537 | A1* | 10/2016 | Sugiyama | ............... H01L 23/13 |

FOREIGN PATENT DOCUMENTS

| | | |
|---|---|---|
| WO | 2011/148915 A1 | 12/2011 |
| WO | 2012/096277 A1 | 7/2012 |
| WO | 2012/165111 A1 | 12/2012 |

OTHER PUBLICATIONS

Written Opinion for International Application No. PCT/JP2017/043780, dated Feb. 27, 2018.

* cited by examiner

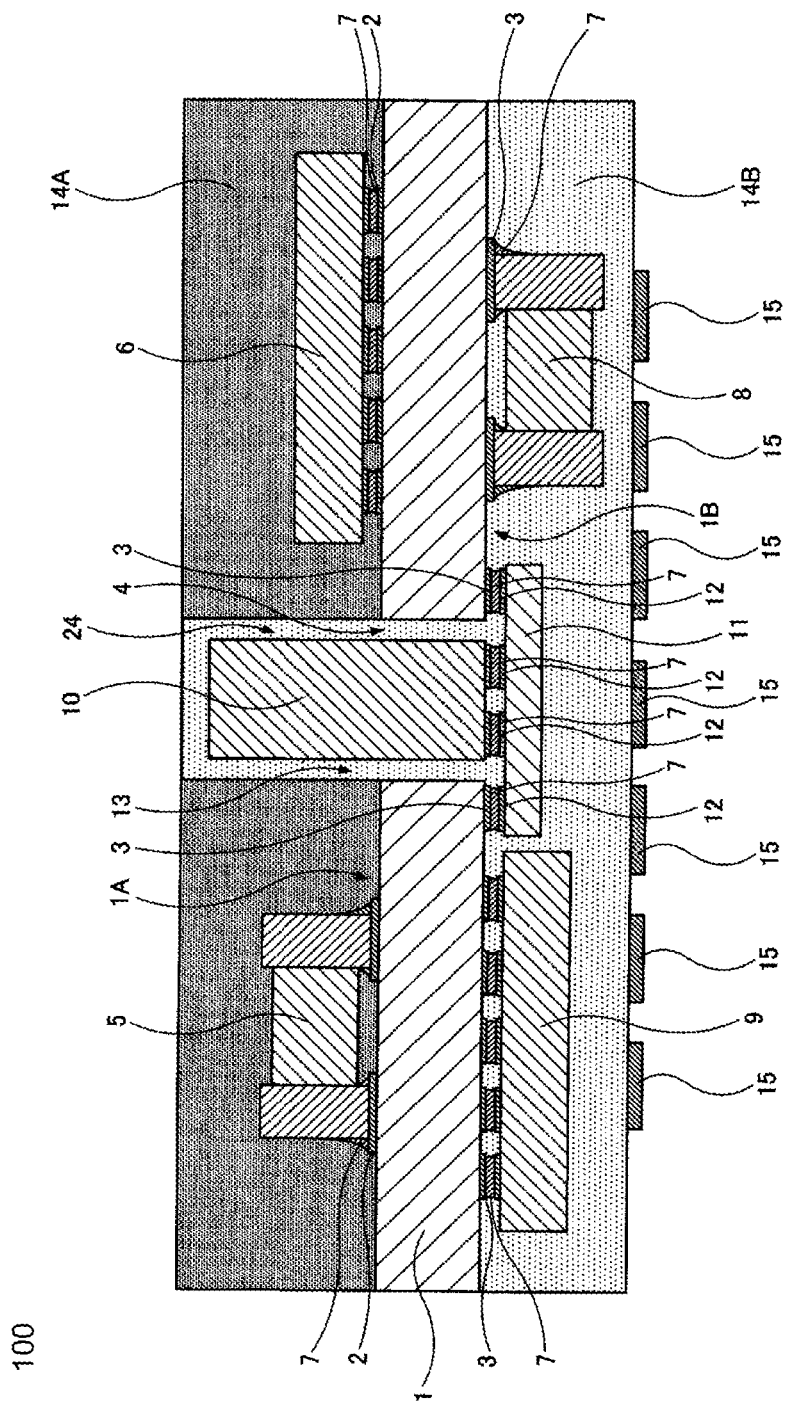

PRINTING (LASER IRRADIATION)

PRIOR ART

ELECTRONIC MODULE AND METHOD OF MANUFACTURING ELECTRONIC MODULE

This is a continuation of International Application No. PCT/JP2017/043780 filed on Dec. 6, 2017 which claims priority from Japanese Patent Application No. 2016-243794 filed on Dec. 15, 2016. The contents of these applications are incorporated herein by reference in their entireties.

BACKGROUND

Technical Field

The present disclosure relates to an electronic module.

Patent Document 1 (Japanese Patent No. 5454681) discloses an electronic module in which a through hole is formed in a substrate in order to mount an electronic component having a large height and in which the electronic component having a large height is placed in the through hole.

FIG. 10 illustrates an electronic module (a module substrate) 1000 disclosed in Patent Document 1.

The electronic module 1000 includes a substrate (a core substrate) 101. A through hole (a cavity) 102 is formed in the substrate 101 so as to extend through an upper main surface and a lower main surface of the substrate 101.

Electronic components 103 are mounted on the upper main surface and the lower main surface of the substrate 101.

In addition, the electronic module 1000 includes an electronic component 104 having a large height (having a large thickness). A plurality of electrodes are formed on a bottom surface of the electronic component 104, and the electronic component 104 is mounted on a relay board (a small piece of board) 105 by using these electrodes. The relay board 105 is mounted on a peripheral edge portion of the through hole 102 that is located on the upper main surface of the substrate, so that the electronic component 104 is placed in the through hole 102.

The electronic module 1000 includes sealing resin portions (resin layers) 106. The sealing resin portions 106 are formed on both the upper main surface and the lower main surface of the substrate 101. In addition, the area between the inner wall of the through hole 102 and the electronic component 104 is filled with the sealing resin portions 106. The sealing resin portions 106 are made of a single type of resin. In other words, the sealing resin portions 106 that are located on the upper main surface of the substrate 101, on the lower main surface of the substrate 101, and in the through hole 102 are made of a single type of resin.

Note that, in the electronic module 1000, the relay board 105 is mounted on a portion of the upper main surface of the substrate where the through hole 102 is formed, and the electronic component 104 having a large height is disposed so as to project from the lower main surface of the substrate 101. However, this configuration can be modified such that the relay board 105 is mounted on a portion of the lower main surface of the substrate where the through hole 102 is formed and such that the electronic component 104 having a large height is disposed so as to project from the upper main surface of the substrate 101. In particular, in the case where the thickness dimension of the sealing resin portion 106 on the upper main surface of the substrate 101 is larger than the thickness dimension of the sealing resin portion 106 on the lower main surface of the substrate 101, it is more advantageous to mount the relay board 105 onto the portion of the lower main surface of the substrate where the through hole 102 is formed and to dispose the electronic component 104 having a large height such that the electronic component 104 projects from the upper main surface of the substrate 101 because an electronic component having a large height (having a large thickness) can be employed by the electronic component 104.

Patent Document 1: Japanese Patent No. 5454681

BRIEF SUMMARY

In the case where the electronic module 1000 is modified such that the relay board 105 is mounted on the portion of the lower main surface of the substrate 101 where the through hole 102 is formed and such that the electronic component 104 having a large height is disposed so as to project from the upper main surface of the substrate 101, there are problems as described below.

In the case where the electronic component 104 having a large height is disposed so as to project from the upper main surface of the substrate 101, there is a case where irregularities are formed on the top surface of the sealing resin portion 106, which is formed on the upper main surface of the substrate 101, as a result of heat being applied to the electronic module 1000. In other words, in the case where the electronic component 104 having a large height is disposed so as to project from the upper main surface of the substrate 101, the thickness dimension of the resin injected in the through hole 102 is added to the thickness dimension of the sealing resin portion 106 in the vicinity of the electronic component 104, so that the thickness dimension of the sealing resin portion 106 in the vicinity of the electronic component 104 becomes extremely larger than the thickness dimension of the other portion (the portion where the through hole 102 is not formed). Thus, for example, in the case of mounting the electronic module 1000 by reflow soldering, when heat is applied to the electronic module 1000, there is a case where the top surface of the sealing resin portion 106 that is located immediately above the through hole 102 greatly expands and protrudes compared with the other portion, so that irregularities are formed on the top surface. In other words, there is a case where irregularities are formed on the top surface of the sealing resin portion 106, which is formed on the upper main surface of the substrate 101, as a result of heat being applied to the electronic module 1000.

In addition, if information items such as a product number, a production date, a production lot, and an orientation have been printed on the top surface of the sealing resin portion 106 that is located immediately above the through hole 102, there is a possibility that the printed information items will be deformed and will become unreadable.

The present disclosure has been made to solve the above-described problems in the related art, and an electronic module according to the present disclosure includes a substrate that has a first main surface and a second main surface, at least one first electronic component that is mounted on the first main surface, at least one second electronic component that is mounted on the second main surface, a first sealing resin portion that is formed on the first main surface so as to cover the first electronic component, and a second sealing resin portion that is formed on the second main surface so as to cover the second electronic component. At least one through hole is formed so as to extend through the substrate and the first sealing resin portion. A third electronic component is placed in the through hole. An area between an inner wall of the through hole and the third electronic component is filled with the second sealing resin portion, and the second sealing resin portion is formed so as to be exposed at a surface of the first sealing resin portion. When viewed in a direction normal to the substrate in a see-through manner, the second sealing resin portion surrounds the third electronic component. The first sealing resin portion and the second sealing resin portion are made of different types of resins.

Note that the wording "the first sealing resin portion and the second sealing resin portion are made of different types of resins" refers to the case where there is a difference in at least one of, for example, composition, degree of shrinkage on curing, degree of cure, coefficient of linear expansion, Young's modulus, color, presence of a filler, content of a filler, size of a filler, glass transition point, and so forth between the resin out of which the first sealing resin portion is made and the resin out of which the second sealing resin portion is made.

Printing can be performed on a surface of the first sealing resin portion excluding a surface of the second sealing resin portion that is partially exposed. This is because if printing is performed on an area excluding the surface of the second sealing resin portion that is partially exposed, even in the case where the electronic module that has been completed is heated by, for example, reflow soldering, and irregularities are formed on the surface of the first sealing resin portion including the surface of the second sealing resin portion that is partially exposed, the visibility of the printed character will not be impaired by the irregularities. In other words, irregularities that are formed as a result of heat being applied are formed on the surface of the first sealing resin portion mainly around the surface of the second sealing resin portion, which is partially exposed, and thus, if printing is performed on an area excluding the surface of the second sealing resin portion, which is partially exposed, the visibility of the printed character will not be impaired by the irregularities.

The resin out of which the first sealing resin portion can be made and the resin out of which the second sealing resin portion is made have different coefficients of linear expansion. In this case, the probability of warpage occurring when heat is applied can be reduced by adjusting the coefficient of linear expansion of the resin out of which the first sealing resin portion is made and the coefficient of linear expansion of the resin out of which the second sealing resin portion is made.

In addition, the resin out of which the first sealing resin portion can be made and the resin out of which the second sealing resin portion is made have different Young's moduli. In this case, the probability of warpage occurring when heat is applied can be reduced by adjusting the Young's modulus of the resin out of which the first sealing resin portion is made and the Young's modulus of the resin out of which the second sealing resin portion is made.

A thickness dimension of the first sealing resin portion can be larger than a thickness dimension of the second sealing resin portion at a portion in which the through hole is not formed. In this case, the height dimension of the electronic component that is placed into the through hole can be set larger.

A method of manufacturing an electronic module according to the present disclosure includes, in the order listed below, preparing a substrate that has a first main surface and a second main surface and in which at least one through hole is formed so as to extend through between the first main surface and the second main surface, mounting a second electronic component onto the second main surface of the substrate and placing a third electronic component into the through hole of the substrate such that the third electronic component partially projects from the first main surface of the substrate, forming a second sealing resin portion onto the second main surface of the substrate, into a gap formed between the through hole and the third electronic component, and in a vicinity of the third electronic component partially projecting from the first main surface of the substrate such that the second sealing resin portion covers the second electronic component and the third electronic component, mounting the first electronic component onto the first main surface of the substrate, and forming a first sealing resin portion onto the first main surface of the substrate such that the first sealing resin portion covers the first electronic component and surrounds the second sealing resin portion, which is formed in the vicinity of the third electronic component on the first main surface of the substrate. The first sealing resin portion and the second sealing resin portion are made of different types of resins, and the second sealing resin portion is partially exposed at a surface of the first sealing resin portion.

Another method of manufacturing an electronic module according to the present disclosure includes, in the order listed below, preparing a substrate that has a first main surface and a second main surface, mounting the first electronic component onto the first main surface of the substrate, forming a first sealing resin portion onto the first main surface of the substrate such that the first sealing resin portion covers the first electronic component, forming at least one through hole that extends through the substrate and the first sealing resin portion, mounting the second electronic component onto the second main surface of the substrate and placing the third electronic component into the through hole of the substrate, and forming a second sealing resin portion onto the second main surface of the substrate and into the through hole such that the second sealing resin portion covers the second electronic component and the third electronic component. The first sealing resin portion and the second sealing resin portion are made of different types of resins, and the second sealing resin portion is partially exposed at a surface of the first sealing resin portion.

The above-described method of manufacturing an electronic module according to the present disclosure can further include forming a printed character onto a portion of the surface of the first sealing resin portion excluding a portion at which the second sealing resin portion is exposed. In this case, information items such as the type, the product number, the production date, the production lot, and the orientation of the electronic module can be printed. Note that that the forming a printed character can be performed by laser irradiation. In this case, printing can be easily performed.

In an electronic module according to the present disclosure, a first sealing resin portion and a second sealing resin portion are made of different types of resin, and the second sealing resin portion is partially exposed at a surface of the first sealing resin portion. Thus, the position of a through hole that is formed in a substrate can be easily determined. Although, when heat is applied, irregularities are likely to be formed on a portion of the top surface of the electronic module that is positioned immediately above the through hole, if a printed character is formed in an area excluding this portion, the visibility of the printed character will not be impaired even when irregularities are formed.

In addition, in the electronic module according to the present disclosure, since the first sealing resin portion and the second sealing resin portion are made of different types of resin, the probability of warpage occurring when the first sealing resin portion and the second sealing resin portion are cured or when heat is applied by reflow soldering can be reduced by adjusting, for example, the degrees of shrinkage on curing, the degrees of cure, the coefficients of linear expansion, or the Young's moduli of the resins out of which the first sealing resin portion and the second sealing resin portion are made.

According to a method of manufacturing an electronic module of the present disclosure, an electronic module according to the present disclosure can be easily manufactured.

BRIEF DESCRIPTION OF THE SEVERAL VIEWS OF THE DRAWINGS

FIG. 1 is a sectional view illustrating an electronic module 100 according to a first embodiment of the present disclosure.

DETAILED DESCRIPTION

Figure 2A:
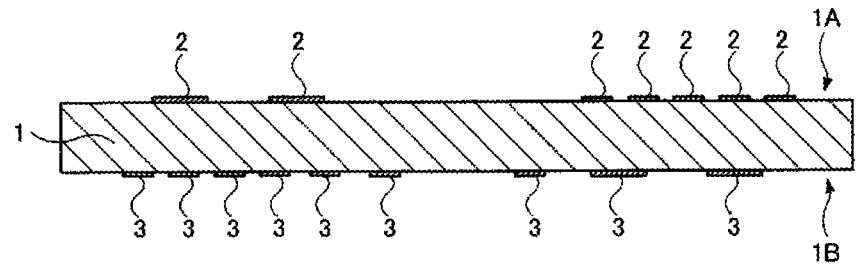
FIGS. 2A to 2D are sectional views illustrating processes that are performed in a first method of manufacturing the electronic module 100.

Embodiments of the present disclosure will be described below with reference to the drawings.

Note that the embodiments are exemplary embodiments of the present disclosure, and the present disclosure is not limited to the contents of the embodiments. In addition, the contents described in the different embodiments may be combined, and the contents of embodiments realized by combining these contents are also included in the scope of the present disclosure. The drawings are provided to aid in understanding the specification and may schematically illustrate components, and the dimensional ratios of the illustrated components or the dimensional ratios of the areas between the components may not match the dimensional ratios described in the specification. In addition, for example, some of the components described in the specification may not be illustrated in the drawings or may be illustrated without necessarily taking account of their plurality.

First Embodiment

FIG. 1 illustrates an electronic module 100 according to a first embodiment. Note that FIG. 1 is a sectional view of the electronic module 100.

The electronic module 100 includes a substrate 1. The material out of which the substrate 1 is made is arbitrary, and for example, a resin substrate that is made by using, for example, a polychlorinated biphenyl (PCB) or a ceramic substrate that is made by using, for example, a low-temperature co-fired ceramic (LTCC) can be used. The structure of the substrate 1 is also arbitrary, and the substrate 1 may be a multilayer substrate or may be a single-layer substrate.

The substrate 1 has a first main surface 1A (an upper main surface) and a second main surface 1B (a lower main surface).

A circuit wiring pattern 2 is formed on the first main surface 1A, and a circuit wiring pattern 3 is formed on the second main surface 1B. The circuit wiring patterns 2 and 3 are made of, for example, a metal such as silver or copper.

A via conductor (not illustrated) is formed in the substrate 1 so as to extend through between the first main surface 1A and the second main surface 1B and so as to connect a predetermined portion of the circuit wiring pattern 2 and a predetermined portion of the circuit wiring pattern 3 to each other.

A through hole 4 is formed in the substrate 1 so as to extend through between the first main surface 1A and the second main surface 1B. An electronic component 10 that is a third electronic component (described later) is to be placed (accommodated) into the through hole 4. The through hole 4 is formed to be larger than the electronic component 10 by 100 μm to 1,000 μm in order to improve the fluidity of a resin when a second sealing resin portion 14B, which will be described later, is formed.

The electronic module 100 includes electronic components 5 and 6 as first electronic components that are mounted on the first main surface 1A of the substrate 1. The electronic component 5 is a chip component that includes electrodes formed at the ends thereof. The electronic component 6 is a land grid array (LGA) component that includes a plurality of electrodes formed on or in a bottom surface thereof. The electrodes of the electronic components 5 and 6 are each connected to the circuit wiring pattern 2 by one of solder portions 7. However, the electrodes of the electronic component 6, which is an LGA component, may be connected to the circuit wiring pattern 2 by bumps (metal bumps, solder bumps, or the like) instead of the corresponding solder portions 7.

The electronic module 100 includes electronic components 8 and 9 as second electronic components that are mounted on the second main surface 1B of the substrate 1. The electronic component 8 is a chip component that includes electrodes formed at the ends thereof. The electronic component 9 is an LGA component that includes a plurality of electrodes formed on or in a bottom surface thereof. The electrodes of the electronic components 8 and 9 are each connected to the circuit wiring pattern 3 by one of the solder portions 7. However, the electrodes of the electronic component 9, which is an LGA component, may be connected to the circuit wiring pattern 3 by bumps (metal bumps, solder bumps, or the like) instead of the corresponding solder portions 7.

The electronic module 100 includes the electronic component 10 as the third electronic component that is placed in the through hole 4. The electronic component 10 is an LGA component that includes a plurality of electrodes formed on or in a bottom surface thereof. The electronic component 10 is placed in the through hole 4 by using a relay board 11 that is provided with circuit wiring patterns 12 formed on one of main surfaces of the relay board 11 (an upper main surface of the relay board 11 in FIG. 1). More specifically, the electrodes of the electronic component 10 are each connected to one of the circuit wiring patterns 12 formed on the relay board 11 by one of the solder portions 7. In addition, another one of the circuit wiring patterns 12 that is formed on the relay board 11 is connected to the circuit wiring pattern 3 formed on the second main surface 1B (the lower main surface) of the substrate 1 by other solder portions 7.

Note that the solder portions 7 that connecting the electrodes of the electronic component 10 to the circuit wiring patterns 12 formed on the relay board 11 can be made of high-melting-point solder. Alternatively, a thermosetting conductive paste may be used instead of these solder portions 7. In contrast, the solder portions 7 that connect the other circuit wiring pattern 12 formed on the relay board 11 to the circuit wiring pattern 3 can be made of low-melting-point solder. In other words, it is necessary to cause the solder portions to satisfy the above-mentioned relationship because the electrodes of the electronic component 10 are connected to the circuit wiring patterns 12 formed on the relay board 11 first, after which the other circuit wiring pattern 12 formed on the relay board 11 is connected to the circuit wiring pattern 3. If not, there is a possibility of the electrodes of the electronic component 10 separating from the circuit wiring pattern 12 of the relay board 11 when the other circuit wiring pattern 12 formed on the relay board 11 is connected to the circuit wiring pattern 3.

A gap 13 is formed between the inner wall of the through hole 4 and the electronic component (the third electronic component) 10 placed in the through hole 4.

In the electronic module 100, a first sealing resin portion 14A is formed on the first main surface 1A of the substrate 1. The first sealing resin portion 14A covers and protects the electronic components (the first electronic components) 5 and 6. The first sealing resin portion 14A is made of, for example, an epoxy resin or a polyimide resin. A through hole 24 is formed in the first sealing resin portion 14A so as to communicate with the through hole 4 of the substrate 1 and so as to reach a surface (a top surface) of the first sealing resin portion 14A.

In the electronic module 100, the second sealing resin portion 14B is formed on the second main surface 1B of the substrate 1. The second sealing resin portion 14B covers and protects the electronic components (the second electronic components) 8 and 9. A portion of the gap 13 between the through hole 4 and the electronic component (the third electronic component) 10 and the other portion of the gap 13 between the through hole 24 formed in the first sealing resin portion 14A and the electronic component 10 are filled with the second sealing resin portion 14B, and the second sealing resin portion 14B is exposed at the surface (the top surface) of the first sealing resin portion 14A. As a result, when viewed in a direction normal to the substrate 1 in a see-through manner, the second sealing resin portion 14B surrounds (covers) and protects the electronic component 10. The second sealing resin portion 14B is also made of, for example, an epoxy resin or a polyimide resin.

A plurality of connection terminals 15 are formed on the bottom surface of the second sealing resin portion 14B. The connection terminals 15 are made of, for example, a metal such as silver or copper. Although not illustrated, predetermined portions of the circuit wiring pattern 3 formed on the substrate 1 and the connection terminals 15 are connected to one another as necessary by conductor vias that are formed so as to extend through the second sealing resin portion 14B.

Although not illustrated, information items such as the type, the product number, the production date, the production lot, and the orientation of the electronic module 100 are printed by using numbers, symbols, letters, and the like on the surface of the first sealing resin portion 14A excluding the second sealing resin portion 14B that is partially exposed. The printed information items are formed by, for example, laser irradiation, and portions of the surface of the first sealing resin portion 14A are engraved to a predetermined depth.

A shield film may be formed on the top surface and the four side surfaces of the electronic module 100 as necessary. In this case, the shield film can reduce the probability of noise entering the electronic module 100 from the outside and also can reduce the probability of the electronic module 100 emitting noise to the outside. Note that the shield film can be connected to the connection terminals 15 having a ground potential.

In the electronic module 100, the first sealing resin portion 14A and the second sealing resin portion 14B are made of different types of resins. Note that the wording "being made of different types of resins" refers to the case where there is a difference in at least one of, for example, composition, degree of shrinkage on curing, degree of cure, coefficient of linear expansion, Young's modulus, color, presence of a filler, content of a filler, size of a filler, and so forth between the resin material of the first sealing resin portion 14A and the resin material of the second sealing resin portion 14B.

Since the first sealing resin portion 14A and the second sealing resin portion 14B are made of different types of resins, the electronic module 100 can suppress occurrence of warpage.

For example, if the first sealing resin portion 14A and the second sealing resin portion 14B are made of the same type of resin, warpage may occur in the entire electronic module 100 including the substrate 1 when, for example, the first sealing resin portion 14A and the second sealing resin portion 14B are cured or when the electronic module that has been completed is heated in order to be mounted by reflow soldering. This warpage occurs due to, for example, the unevenness between the thickness dimension of the first sealing resin portion 14A and the thickness dimension of the second sealing resin portion 14B or the unevenness between the total volume of the electronic components (the first electronic components) 5 and 6, which are covered with the first sealing resin portion 14A, and the total volume of the electronic components (the second electronic components) 8 and 9, which are covered with the second sealing resin portion 14B. The occurrence of warpage causes one of the portion of the substrate 1 that is located on the side on which the first main surface 1A is present and the portion of the substrate 1 that is located on the side on which the second main surface 1B is present to contract and causes the other of these portions of the substrate 1 to expand.

In the case where warpage occurs when the first sealing resin portion 14A and the second sealing resin portion 14B are cured, the occurrence of warpage can be suppressed by adjusting the degree of shrinkage on curing of the resin material of the first sealing resin portion 14A when the resin is cured and the degree of shrinkage on curing of the resin material of the second sealing resin portion 14B when the resin is cured. More specifically, if both the first sealing resin portion 14A and the second sealing resin portion 14B are made of the resin material of the first sealing resin portion 14A, or if both the first sealing resin portion 14A and the second sealing resin portion 14B are made of the resin material of the second sealing resin portion 14B, when one of the portion of the substrate 1 located on the side on which the first main surface 1A is present and the portion of the substrate 1 located on the side on which the second main surface 1B is present contracts, and the other of these portions of the substrate 1 expands at the time of curing the first sealing resin portion 14A and the second sealing resin portion 14B, and as a result, warpage occurs, a resin with a low degree of shrinkage on curing may be used as one of the resin material of the first sealing resin portion 14A and the resin material of the second sealing resin portion 14B that is formed on the side on which contraction occurs, and a resin with a high degree of shrinkage on curing may be used as one of the resin material of the first sealing resin portion 14A and the resin material of the second sealing resin portion 14B that is formed on the side on which expansion occurs, so that the probability of warpage occurring when the first sealing resin portion 14A and the second sealing resin portion 14B are cured can be reduced.

Alternatively, in the case where warpage occurs when the first sealing resin portion 14A and the second sealing resin portion 14B are cured, the occurrence of warpage can be suppressed by adjusting the degree of cure of the resin material of the first sealing resin portion 14A and the degree of cure of the resin material of the second sealing resin portion 14B. More specifically, if both the first sealing resin portion 14A and the second sealing resin portion 14B are made of the resin material of the first sealing resin portion 14A, or if both the first sealing resin portion 14A and the second sealing resin portion 14B are made of the resin material of the second sealing resin portion 14B, when one of the portion of the substrate 1 located on the side on which the first main surface 1A is present and the portion of the substrate 1 located on the side on which the second main surface 1B is present contracts, and the other of these portions of the substrate 1 expands at the time of curing the first sealing resin portion 14A and the second sealing resin portion 14B, and as a result, warpage occurs, a resin having a low degree of cure may be used as one of the resin material of the first sealing resin portion 14A and the resin material of the second sealing resin portion 14B that is formed on the side on which contraction occurs, and a resin having a high degree of cure may be used as one of the resin material of the first sealing resin portion 14A and the resin material of the second sealing resin portion 14B that is formed on the side on which expansion occurs, so that the probability of warpage occurring when the first sealing resin portion 14A and the second sealing resin portion 14B are cured can be reduced.

In addition, in the case where warpage occurs when, for example, the electronic module that has been completed is heated in order to be mounted by reflow soldering, the occurrence of warpage can be suppressed by adjusting the coefficient of linear expansion of the resin material of the first sealing resin portion 14A and the coefficient of linear expansion of the resin material of the second sealing resin portion 14B. More specifically, if both the first sealing resin portion 14A and the second sealing resin portion 14B are made of the resin material of the first sealing resin portion 14A, or if both the first sealing resin portion 14A and the second sealing resin portion 14B are made of the resin material of the second sealing resin portion 14B, when one of the portion of the substrate 1 located on the side on which the first main surface 1A is present and the portion of the substrate 1 located on the side on which the second main surface 1B is present contracts, and the other of these portions of the substrate 1 expands at the time of applying heat to the electronic module after the electronic module has been completed, and as a result, warpage occurs, a resin having a high coefficient of linear expansion may be used as one of the resin material of the first sealing resin portion 14A and the resin material of the second sealing resin portion 14B that is formed on the side on which contraction occurs, and a resin having a low coefficient of linear expansion may be used as one of the resin material of the first sealing resin portion 14A and the resin material of the second sealing resin portion 14B that is formed on the side on which expansion occurs, so that the probability of warpage occurring when heat is applied can be reduced.

Alternatively, in the case where warpage occurs when, for example, the electronic module that has been completed is heated in order to be mounted by reflow soldering, the occurrence of warpage can be suppressed by adjusting the Young's modulus of the resin material of the first sealing resin portion 14A and the Young's modulus of the resin material of the second sealing resin portion 14B. More specifically, if both the first sealing resin portion 14A and the second sealing resin portion 14B are made of the resin material of the first sealing resin portion 14A, or if both the first sealing resin portion 14A and the second sealing resin portion 14B are made of the resin material of the second sealing resin portion 14B, when one of the portion of the substrate located on the side on which the first main surface is present and the portion of the substrate located on the side on which the second main surface is present contracts, and the other of these portions of the substrate expands at the time of applying heat to the electronic module after the electronic module has been completed, and as a result, warpage occurs, a resin with a low Young's modulus may be used as one of the resin material of the first sealing resin portion 14A and the resin material of the second sealing resin portion 14B that is formed on the side on which contraction occurs, and a resin with a high Young's modulus may be used as one of the resin material of the first sealing resin portion 14A and the resin material of the second sealing resin portion 14B that is formed on the side on which expansion occurs, so that the probability of warpage occurring when heat is applied can be reduced.

In addition, in the electronic module 100, since the resin material of the first sealing resin portion 14A and the resin material of second sealing resin portion 14B are different types of resins, the position of the through hole 4 formed in the substrate 1 can be determined from the top-surface side. In other words, the types of the resins on the top surface of the electronic module 100 are different from each other, there is an interface formed between the first sealing resin portion 14A and the second sealing resin portion 14B, which is partially exposed at the first sealing resin portion 14A, and the approximate position of the through hole 4 formed in the substrate 1 can be determined.

Although irregularities are likely to be formed on a portion of the top surface of the electronic module 100 that is located immediately above the through hole 4 when heat is applied at the time of performing, for example, reflow soldering, in the electronic module 100, since the position of the through hole 4 formed in the substrate 1 can be determined beforehand from the top-surface side by using the second sealing resin portion 14B, which is partially exposed at the first sealing resin portion 14A, as a guide, and thus, information items can be printed on an area excluding this portion. In this case, even if irregularities are formed on the top surface, the visibility of the printed information items will not be impaired.

In addition, although the top surface of the electronic component (the third electronic component) 10 having a large height is often positioned directly under the second sealing resin portion 14B, which is partially exposed at the first sealing resin portion 14A, in the electronic module 100, information items can be printed on an area excluding this portion, and thus, even if printing is performed by laser irradiation, it is unlikely that the electronic component 10 will become damaged (e.g., being caused to melt) by laser irradiation.

The electronic module 100 according to the first embodiment, which has the above-described structure, can be easily manufactured by, for example, two manufacturing methods that will be described below. Note that, in the actual manufacturing process, a mother substrate is used, and a large number of electronic modules 100 are collectively manufactured by singulating the mother substrate during the process. However, in the following description, a case of manufacturing a single electronic module 100 will be described for convenience of description.

<First Method of Manufacturing Electronic Module 100>

First, as illustrated in FIG. 2A, the substrate 1 that includes the circuit wiring pattern 2 and the circuit wiring pattern 3, which are respectively formed on the first main surface 1A and the second main surface 1B, and that has the via conductor (not illustrated) formed so as to extend through between these main surfaces and so as to connect the predetermined portion of the circuit wiring pattern 2 and the predetermined portion of the circuit wiring pattern 3 to each other is prepared. Note that in the case where the substrate 1 is a ceramic substrate made of, for example, an LTCC, the through hole 4 is formed in the substrate 1 by, for example, a method that will be described below at the same time as the substrate 1 is manufactured.

In the case where the substrate 1, which is a ceramic substrate, is a multilayer substrate, hollowed-out holes are formed in ceramic green sheets before the ceramic green sheets are laminated together, and the plurality of ceramic green sheets in which the hollowed-out holes have been formed are laminated together so as to fabricate an unfired ceramic substrate. Then, by firing the unfired ceramic substrate, the through hole 4 can be formed in the substrate 1 that has been fired. Alternatively, a plurality of ceramic green sheets may be laminated together so as to form an unfired ceramic substrate, and laser irradiation or cutting using a router or the like may be performed on the unfired ceramic substrate so as to form the through hole 4. Then, the unfired ceramic substrate may be fired, so that the through hole 4 can be formed in the substrate 1 that has been fired. In the case where the substrate 1, which is a ceramic substrate, is a single-layer substrate, an unfired ceramic substrate is prepared, and laser irradiation or cutting using a router or the like is performed on the unfired ceramic substrate so as to form the through hole 4. Then, the unfired ceramic substrate may be fired, so that the through hole 4 can be formed in the substrate 1 that has been fired.

Figure 2B:
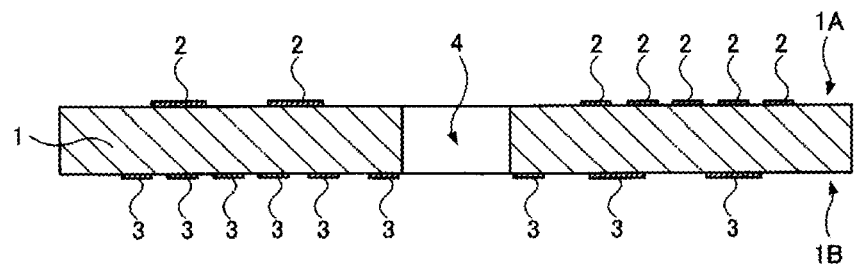

In contrast, in the case where the substrate 1 is a resin substrate made of, for example, a PCB, the through hole 4 is formed in the substrate 1 as illustrated in FIG. 2B. More specifically, the through hole 4 is formed in the substrate 1 by laser irradiation or cutting using a router or the like. As the laser, UV laser, $CO_2$ laser, or the like can be used. Cleaning is performed on the substrate 1 as necessary after the through hole 4 has been formed. The cleaning may be either dry cleaning or wet cleaning. In the case of wet cleaning, ultrasonic cleaning can be performed.

Figure 2C:
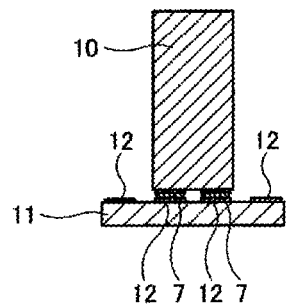

At the same time as the substrate 1 is prepared, the electronic component (the third electronic component) 10 and the relay board 11 are prepared. The circuit wiring patterns 12 have previously been formed on the upper main surface of the relay board 11. Then, as illustrated in FIG. 2C, the electrodes formed on the bottom surface of the electronic component 10 are each connected to the predetermined circuit wiring pattern 12 of the relay board 11 by one of the solder portions 7. Note that high-melting-point solder is used as the solder portions 7, each of which connects one of the electrodes of the electronic component 10 to the corresponding circuit wiring pattern 12 formed on the relay board 11. Alternatively, a thermosetting conductive paste may be used instead of high-melting-point solder.

Figure 2D:
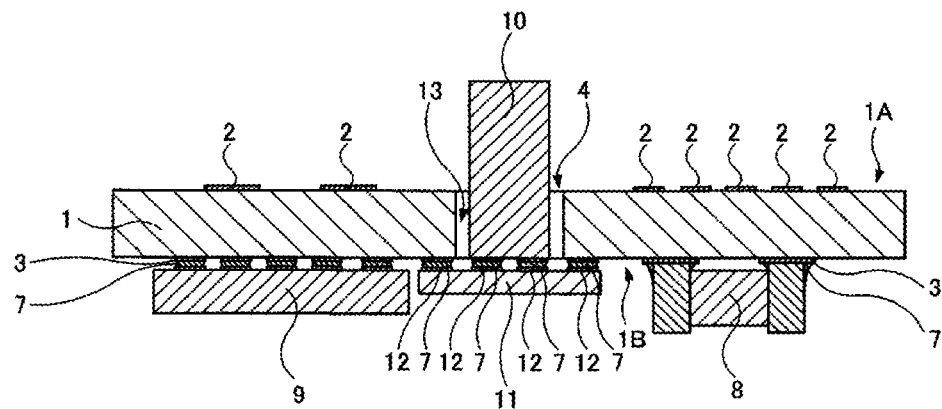

Next, as illustrated in FIG. 2D, the relay board 11 on which the electronic components (the second electronic components) 8 and 9 and the electronic component 10 have been mounted is mounted onto the circuit wiring pattern 3, which has been formed on the second main surface 1B of the substrate 1, by the corresponding solder portions 7. Note that low-melting-point solder is used as the solder portions 7 that are used for this mounting operation. As a result, the electronic component 10 is placed in the through hole 4. Then, the gap 13 is formed between the inner wall of the through hole 4 and the electronic component 10. In addition, the electronic component 10 is partially exposed at the first main surface 1A of the substrate 1.

Figure 3E:
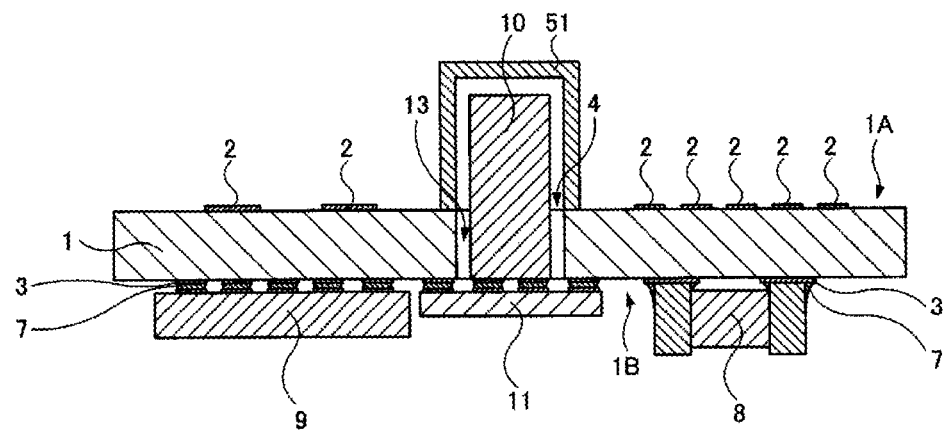
FIGS. 3E to 3G are sectional views illustrating processes that are performed subsequent to the process illustrated in FIG. 2D in the first method of manufacturing the electronic module 100.

Subsequently, as illustrated in FIG. 3E, the electronic component 10 that is partially exposed at the first main surface 1A of the substrate 1 is covered with a molding jig 51 that has the shape of a cap. The molding jig 51 has an internal dimension larger than that of the electronic component 10.

Figure 3F:
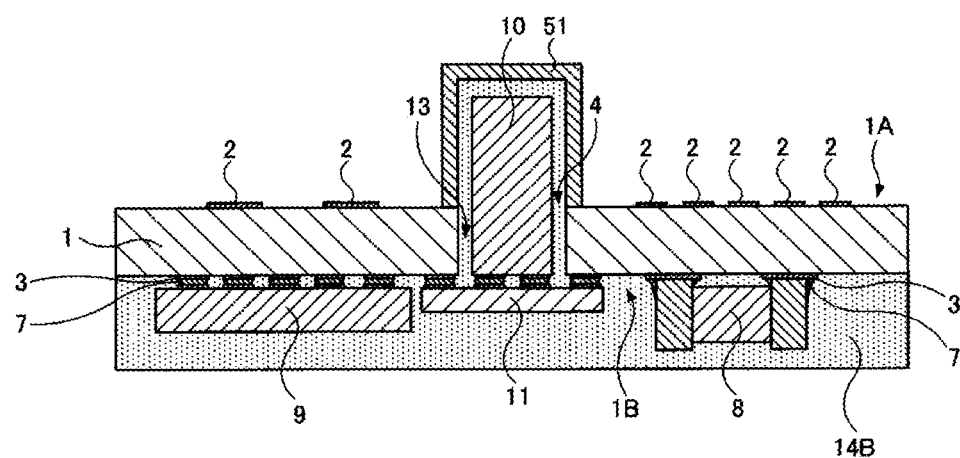

Then, as illustrated in FIG. 3F, a resin in a liquid state is supplied onto the second main surface 1B of the substrate 1, into the through hole 4 of the substrate 1, and into the molding jig 51, which is disposed on the first main surface of the substrate 1 and then is cured so as to form the second sealing resin portion 14B. As a result, the electronic components 8 and 9, which are the second electronic components, are covered with the second sealing resin portion 14B. In addition, the electronic component 10, which is the third electronic component, is covered with (surrounded by) the second sealing resin portion 14B. Note that, in the present embodiment, although the second sealing resin portion 14B is formed by using the liquid resin, instead of this method, transfer molding, compression molding, or the like may be employed. In the case of transfer molding, the substrate 1 on which the electronic components 8 and 9 and the electronic component 10, which is connected to the relay board 11, have been mounted is placed into a metal mold (not illustrated), and a resin is injected into the metal mold through a resin injection hole and cured to be molded. In the case of compression molding, both the substrate 1 on which the electronic components 8 and 9 and the electronic component 10, which is connected to the relay board 11, have been mounted and a resin that has been weighed are simultaneously placed in a metal mold (not illustrated) and then pressurized and cured to be molded.

Figure 3G:
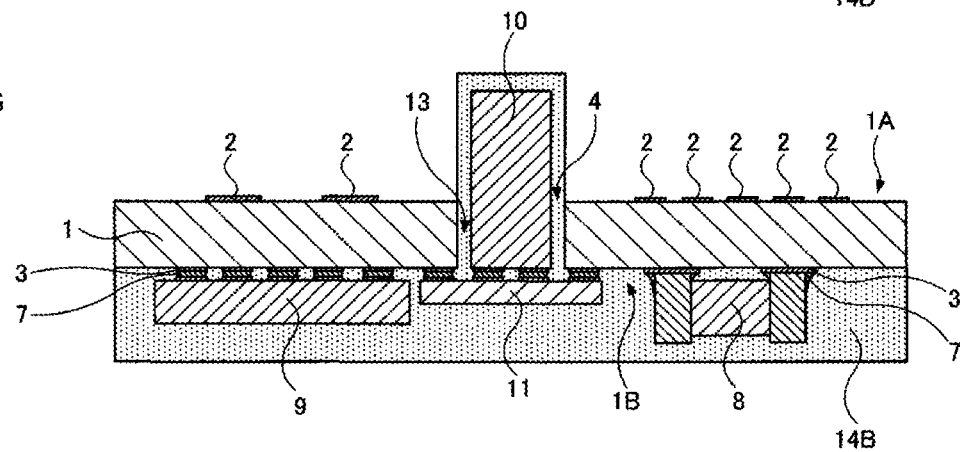

Next, as illustrated in FIG. 3G, the molding jig 51 is removed from the second sealing resin portion 14B.

Figure 4H:
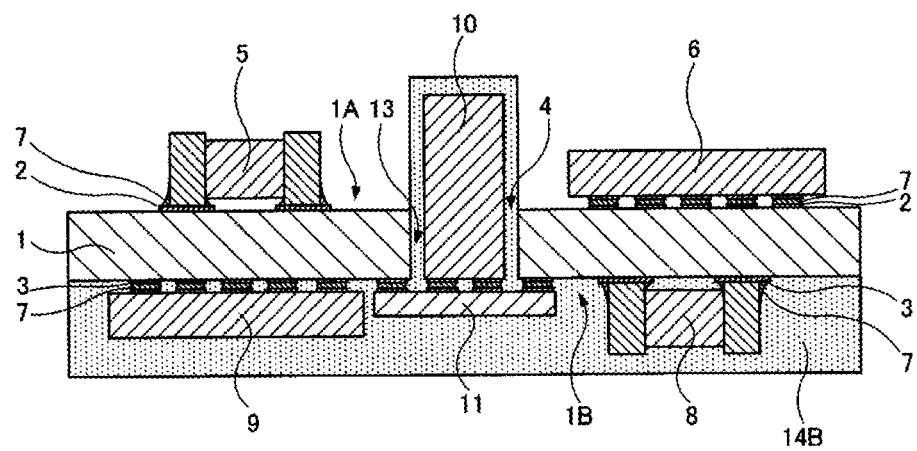
FIGS. 4H to 4J are sectional views illustrating processes that are performed subsequent to the process illustrated in FIG. 3G in the first method of manufacturing the electronic module 100.

Then, as illustrated in FIG. 4H, the electronic components (the first electronic components) 5 and 6 are mounted onto the circuit wiring pattern 2, which has been formed on the first main surface 1A of the substrate 1, by the corresponding solder portions 7.

Figure 4I:
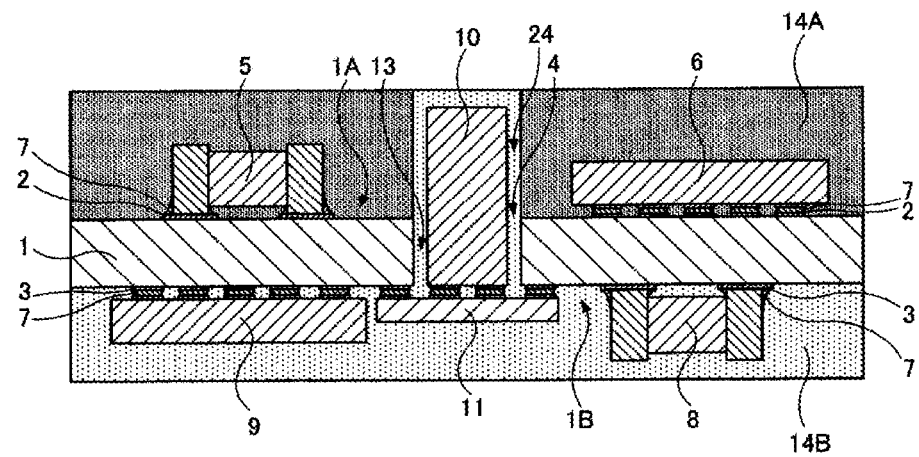

Subsequently, as illustrated in FIG. 4I, the first sealing resin portion 14A is formed onto the first main surface 1A of the substrate 1. As a result, the electronic components 5 and 6, which are the first electronic components, are covered with the first sealing resin portion 14A. Note that molding using a liquid resin, transfer molding, compression molding, molding using a sheet resin, or the like can be employed for formation of the first sealing resin portion 14A. Note that, in the case of molding using a sheet resin, a resin sheet in a semi-molten state is stacked onto the electronic components 5 and 6, which have been mounted on the first main surface 1A of the substrate 1 and then is pressurized and cured to be molded.

Figure 4J:
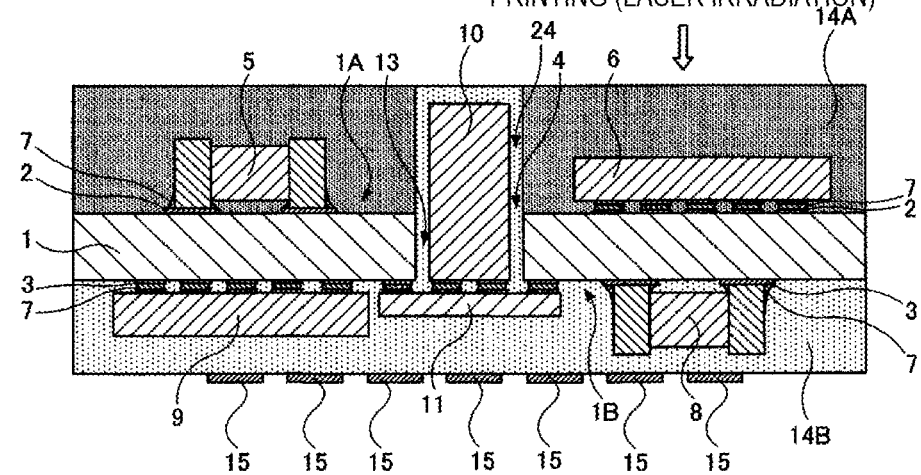

Next, as illustrated in FIG. 4J, the connection terminals 15 are formed onto the bottom surface of the second sealing resin portion 14B by, for example, sputtering. In addition, laser is radiated onto the surface of the first sealing resin portion 14A excluding the second sealing resin portion 14B, which is partially exposed, so as to print numbers, symbols, letters, and so forth that indicate information items such as a type, a product number, a production date, a production lot, and an orientation, so that the electronic module 100 is completed. Note that a shield film may be formed on the top surface and four side surfaces by using a thin-film technique as necessary.

<Second Method of Manufacturing Electronic Module 100>

Figure 5A:
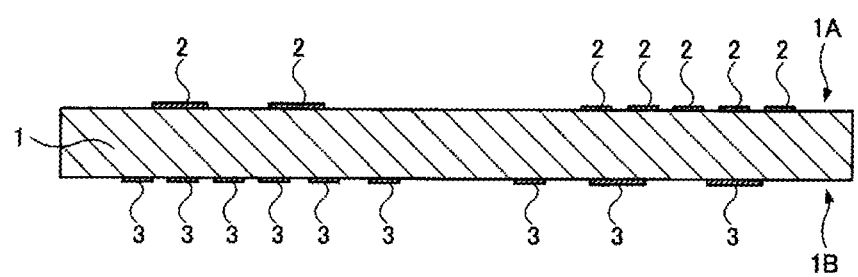
FIGS. 5A to 5C are sectional views illustrating processes that are performed in a second method of manufacturing the electronic module 100.

First, as illustrated in FIG. 5A, the substrate 1 that includes the circuit wiring pattern 2 and the circuit wiring pattern 3, which are respectively formed on the first main surface 1A and the second main surface 1B, and that has the via conductor (not illustrated) formed so as to extend through between these main surfaces and so as to connect the predetermined portion of the circuit wiring pattern 2 and the predetermined portion of the circuit wiring pattern 3 to each other is prepared. Note that the through hole 4 has not yet been formed in the substrate 1 at this point.

Figure 5B:
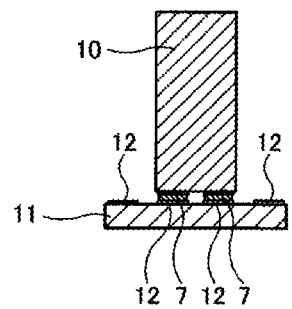

At the same time as the substrate 1 is prepared, the electronic component (the third electronic component) 10 and the relay board 11 are prepared. Then, as illustrated in FIG. 5B, the electrodes formed on the bottom surface of the electronic component 10 are each connected to the predetermined circuit wiring pattern 12 of the relay board 11 by one of the solder portions 7. Note that high-melting-point solder is used as the solder portions 7, each of which connects one of the electrodes of the electronic component 10 to the corresponding circuit wiring pattern 12 formed on the relay board 11.

Figure 5C:
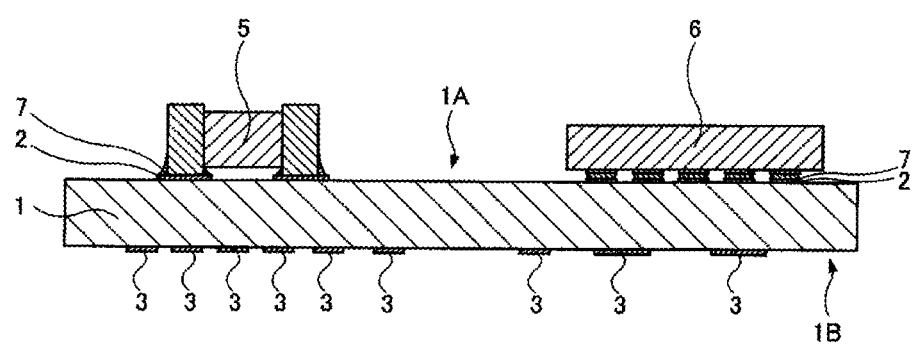

Subsequently, as illustrated in FIG. 5C, the electronic components (the first electronic components) 5 and 6 are mounted onto the circuit wiring pattern 2, which has been formed on the first main surface 1A of the substrate 1, by the corresponding solder portions 7.

Figure 6D:
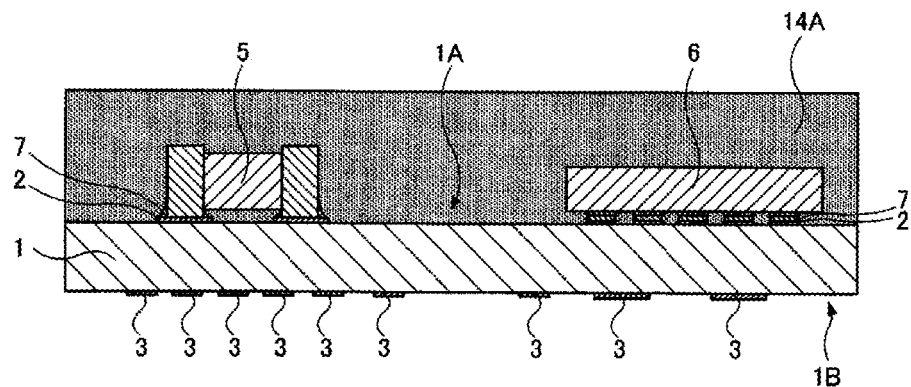
FIGS. 6D to 6F are sectional views illustrating processes that are performed subsequent to the process illustrated in FIG. 5C in the second method of manufacturing the electronic module 100.

Next, as illustrated in FIG. 6D, the first sealing resin portion 14A is formed onto the first main surface 1A of the substrate 1. As a result, the electronic components 5 and 6, which are the first electronic components, are covered with the first sealing resin portion 14A. Note that molding using a liquid resin, transfer molding, compression molding, molding using a sheet resin, or the like can be employed for formation of the first sealing resin portion 14A.

Figure 6E:
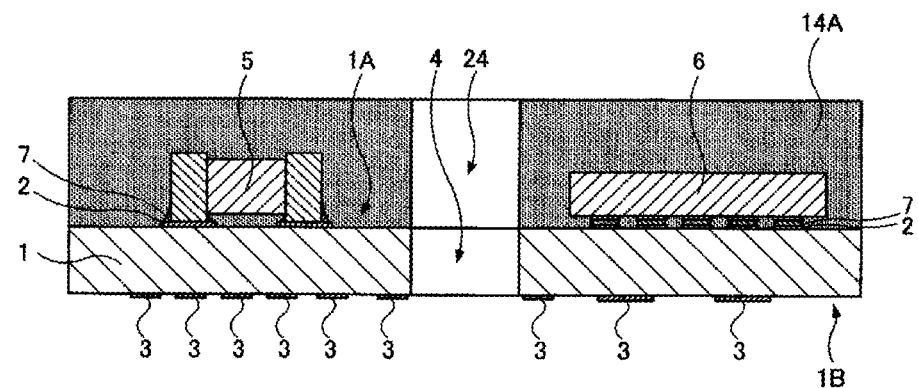

Next, as illustrated in FIG. 6E, the through hole 4 and the through hole 24 are respectively formed into the substrate 1 and the first sealing resin portion 14A so as to extend through the substrate 1 and the first sealing resin portion 14A. The through holes 4 and 24 are formed by laser irradiation or cutting using a router.

Figure 6F:
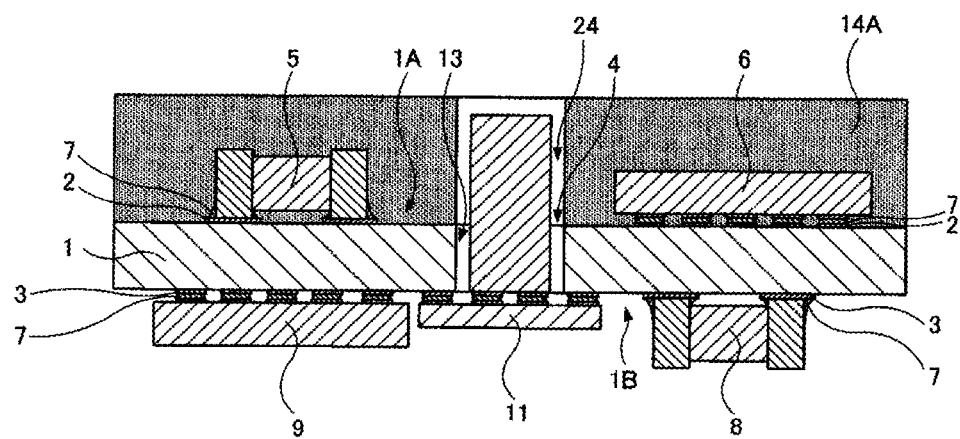

Subsequently, as illustrated in FIG. 6F, the relay board 11 on which the electronic components (the second electronic components) 8 and 9 and the electronic component 10 have been mounted is mounted onto the circuit wiring pattern 3, which has been formed on the second main surface 1B of the substrate 1, by the corresponding solder portions 7. Note that low-melting-point solder is used as the solder portions 7 that are used for this mounting operation. As a result, the electronic component 10 is placed in the through holes 4 and 24.

Figure 7G:
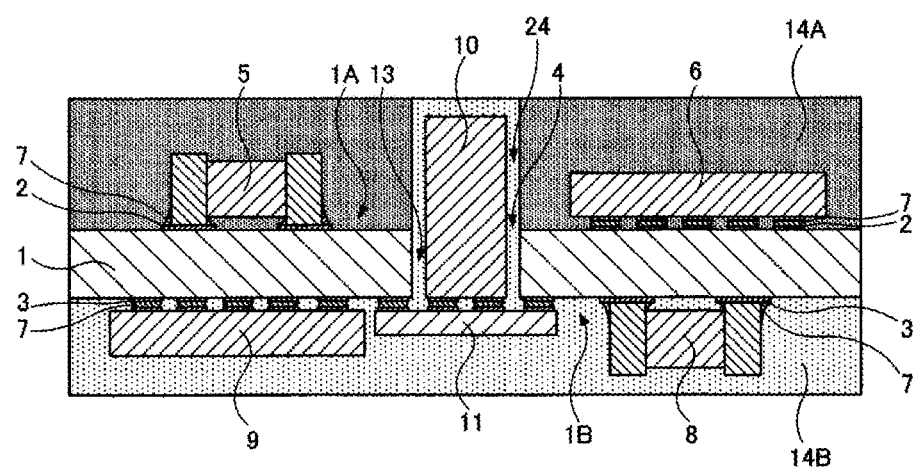
FIGS. 7G and 7H are sectional views illustrating processes that are performed subsequent to the process illustrated in FIG. 6F in the second method of manufacturing the electronic module 100.

Next, as illustrated in FIG. 7G, a resin is supplied onto the second main surface 1B of the substrate 1 and in the through holes 4 and 24 of the substrate 1 and then is cured so as to form the second sealing resin portion 14B. As a result, the electronic components 8 and 9, which are the second electronic components, are covered with the second sealing resin portion 14B. In addition, the electronic component 10, which is the third electronic component, is covered with (surrounded by) the second sealing resin portion 14B. Note that molding using a liquid resin, transfer molding, compression molding, or the like can be employed for formation of the second sealing resin portion 14B.

Figure 7H:
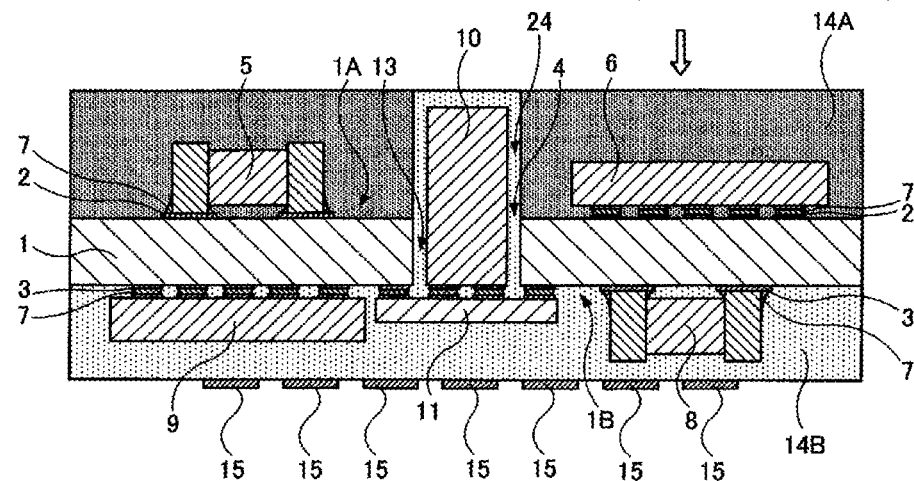

Subsequently, as illustrated in FIG. 7H, the connection terminals 15 are formed onto the bottom surface of the second sealing resin portion 14B by, for example, sputtering. In addition, laser is radiated onto the surface of the first sealing resin portion 14A excluding the second sealing resin portion 14B, which is partially exposed, so as to print numbers, symbols, letters, and so forth that indicate information items such as a type, a product number, a production date, a production lot, and an orientation, so that the electronic module 100 is completed. Note that a shield film may be formed on the top surface and four side surfaces by using a thin-film technique as necessary.

Second Embodiment

Figure 8:
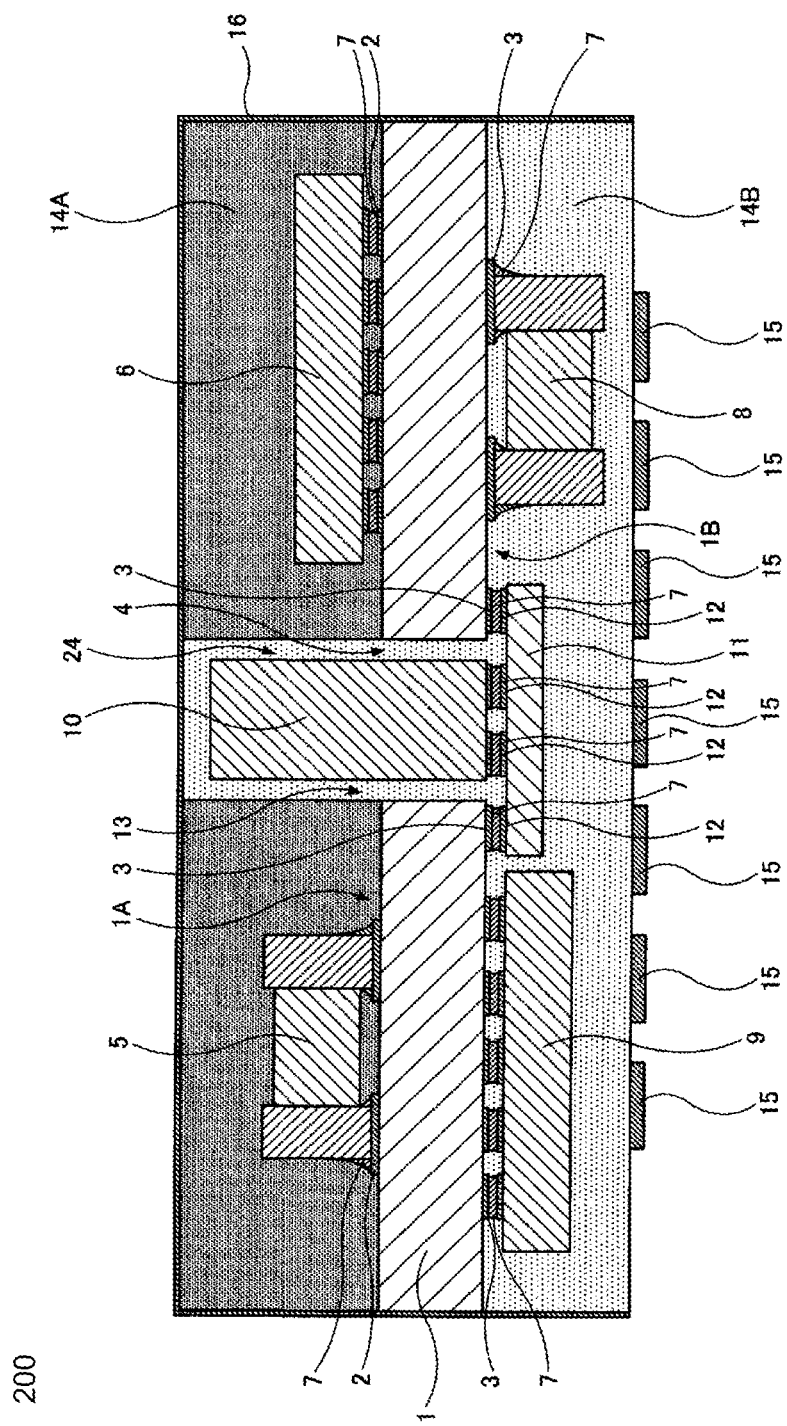
FIG. 8 is a sectional view illustrating an electronic module 200 according to a second embodiment.

FIG. 8 illustrates an electronic module 200 according to a second embodiment. Note that FIG. 8 is a sectional view of the electronic module 200.

The electronic module 200 is obtained by adding a component to the electronic module 100 according to the first embodiment. More specifically, the electronic module 200 is obtained by forming a shield film 16 on the top surface and the four side surfaces of the electronic module 100.

Although not illustrated, the shield film 16 is formed to have a three-layer structure formed of a close-contact layer that is made of Ti, Ni, Cr, SUS, or an alloy containing at least one of these metals, an electrically conductive layer that is made of Cu, Al, Ag, or an alloy containing at least one of these metals, and a corrosion-resistant layer that is made of Ti, Ni, Cr, or an alloy containing at least one of these metals. Note that the shield film 16 can be connected to the connection terminals 15 having a ground potential.

The shield film 16 can be formed by using a thin-film technique. Note that the shield film 16 is usually formed after printing has been performed on the surface of the first sealing resin portion 14A excluding the second sealing resin portion 14B, which is partially exposed. However, the position of the second sealing resin portion 14B exposed at the first sealing resin portion 14A may be determined beforehand, and after the shield film 16 has been formed, information items may be printed by radiating laser onto the shield film 16 located on the first sealing resin portion 14A excluding the portion at which the second sealing resin portion 14B is exposed.

In the electronic module 200, the probability of noise entering the electronic module 200 from the outside can be reduced by the shield film 16. In addition, in the electronic module 200, the probability of the electronic module 200 emitting noise to the outside can be reduced by the shield film 16.

Third Embodiment

Figure 9:
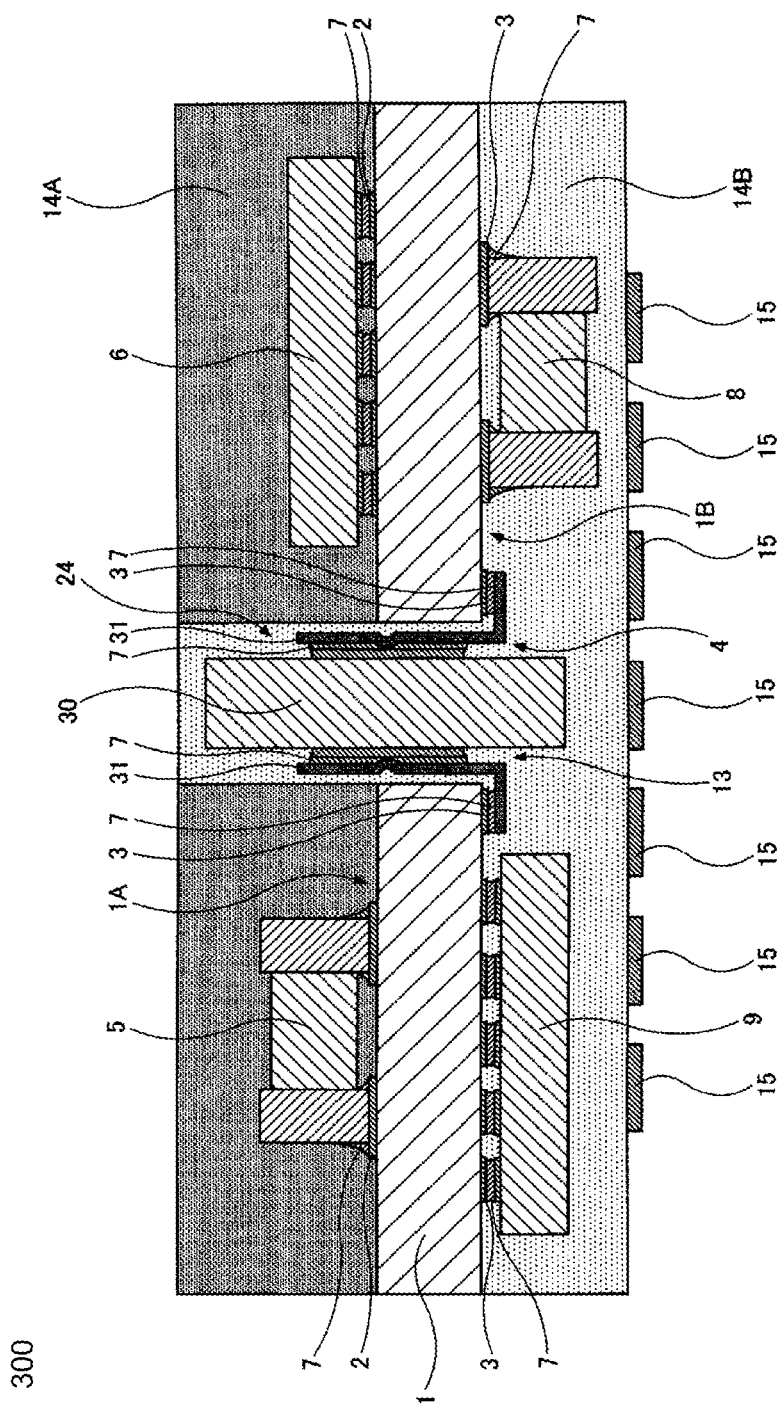
FIG. 9 is a sectional view illustrating an electronic module 300 according to a third embodiment.
Figure 10:
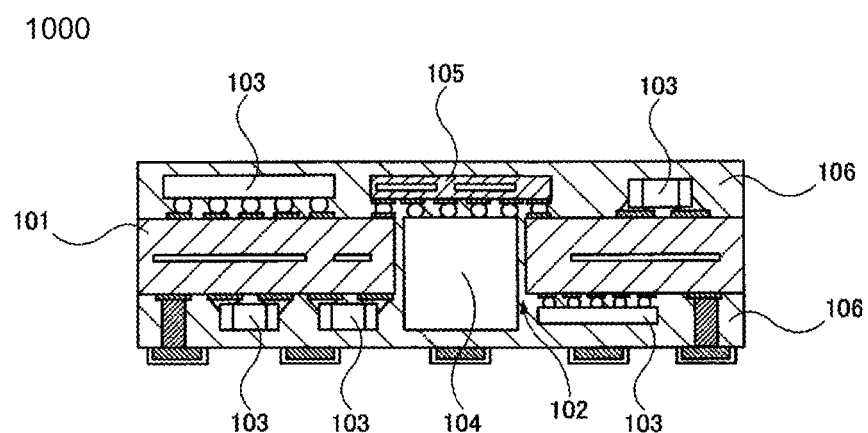
FIG. 10 is a sectional view illustrating an electronic module 1000 disclosed in Patent Document 1.

FIG. 9 illustrates an electronic module 300 according to a third embodiment. Note that FIG. 9 is a sectional view of the electronic module 300.

The electronic module 300 is obtained by making a change to the electronic module 100 according to the first embodiment. More specifically, in the electronic module 100, although the electronic component 10, which is an LGA component that includes the plurality of electrodes formed on the bottom surface thereof, is used as the third electronic component that is placed in the through hole 4, in the electronic module 300, an electronic component 30 that includes electrodes formed on the two side surfaces thereof is used instead of the electronic component 10. More specifically, as illustrated in FIG. 9, L-shaped metal terminals 31 are each connected to one of the electrodes of the electronic component 30 by one of the solder portions 7, and each of the metal terminals 31 is connected to the circuit wiring pattern 3, which is formed on the second main surface 1B of the substrate 1, by another one of the solder portions 7. Note that high-melting-point solder can be used for the solder portions 7 connecting the metal terminals 31 to the electrodes of the electronic component 30 and that low-melting-point solder be used for the solder portions 7 connecting the metal terminals 31 to the circuit wiring pattern 3.

As described above, the third electronic component that is placed in the through hole 4 may be the electronic component 30 that includes the electrodes formed on the side surfaces thereof.

The electronic modules 100 to 300 according to the first to third embodiments have been described above. However, the present disclosure is not limited to the contents described above, and various changes can be made within the scope of the present disclosure.

For example, in the above-described embodiments, although a single through hole is formed in a substrate, and an electronic component is placed in the through hole, a plurality of through holes may be formed in a substrate, and electronic components may be placed in the plurality of through holes.

In addition, in the above-described embodiments, although a single electronic component is placed in a single through hole, for example, two electronic components may be placed in a single through hole by placing the two electronic components in the through hole from the lower side and the upper side of the substrate, respectively.

In addition, an electronic circuit that includes the electronic module is arbitrary, and various electronic circuits may be formed.

REFERENCE SIGNS LIST 1 substrate
1A first main surface
1B second main surface
2 circuit wiring pattern (formed on first main surface 1A)
3 circuit wiring pattern (formed on second main surface 1B)
4 through hole (formed in substrate 1)
5, 6 electronic component (first electronic component)
7 solder portion
8, 9 electronic component (second electronic component)
10, 30 electronic component (third electronic component)
11 relay board
12 circuit wiring pattern (formed on 11)
13 gap
14A first sealing resin portion
14B second sealing resin portion
15 connection terminal
16 shield film
24 through hole (formed in first sealing resin portion 14A)
31 metal terminal
51 molding jig
100, 200, 300 electronic module

The invention claimed is:

1. An electronic module comprising:
a substrate that has a first main surface and a second main surface;
at least one first electronic component that is mounted on the first main surface;
at least one second electronic component that is mounted on the second main surface;
a first sealing resin portion that is provided on the first main surface so as to cover the first electronic component; and
a second sealing resin portion that is provided on the second main surface so as to cover the second electronic component,
wherein at least one through hole is provided so as to extend through the substrate and the first sealing resin portion,
wherein a third electronic component is located in the through hole,
wherein an area between an inner wall of the through hole and the third electronic component is filled with the second sealing resin portion, and the second sealing resin portion is provided so as to be exposed at a surface of the first sealing resin portion,
wherein, when viewed in a direction perpendicular to the first main surface, the second sealing resin portion surrounds the third electronic component, and
wherein the first sealing resin portion and the second sealing resin portion are made of different types of resins.

2. The electronic module according to claim 1,
wherein printing is performed on a surface of the first sealing resin portion excluding a surface of the second sealing resin portion that is exposed at a surface of the first sealing resin portion.

3. The electronic module according to claim 2,
wherein a resin out of which the first sealing resin portion is made and a resin out of which the second sealing resin portion is made have different coefficients of linear expansion.

4. The electronic module according to claim 2,
wherein the resin out of which the first sealing resin portion is made and the resin out of which the second sealing resin portion is made have different Young's modules.

5. The electronic module according to claim 2,
wherein a thickness dimension of the first sealing resin portion is larger than a thickness dimension of the second sealing resin portion at a portion in which the through hole is not provided.

6. The electronic module according to claim 1,
wherein a resin out of which the first sealing resin portion is made and a resin out of which the second sealing resin portion is made have different coefficients of linear expansion.

7. The electronic module according to claim 6,
wherein the resin out of which the first sealing resin portion is made and the resin out of which the second sealing resin portion is made have different Young's modules.

8. The electronic module according to claim 6,
wherein a thickness dimension of the first sealing resin portion is larger than a thickness dimension of the second sealing resin portion at a portion in which the through hole is not provided.

9. The electronic module according to claim 1,
wherein the resin out of which the first sealing resin portion is made and the resin out of which the second sealing resin portion is made have different Young's modules.

10. The electronic module according to claim 9,
wherein a thickness dimension of the first sealing resin portion is larger than a thickness dimension of the second sealing resin portion at a portion in which the through hole is not provided.

11. The electronic module according to claim 1,
wherein a thickness dimension of the first sealing resin portion is larger than a thickness dimension of the second sealing resin portion at a portion in which the through hole is not provided.

12. A method of manufacturing an electronic module comprising, in the order listed below:
preparing a substrate that has a first main surface and a second main surface and in which at least one through hole is provided so as to extend through between the first main surface and the second main surface;
mounting a second electronic component onto the second main surface of the substrate and placing a third electronic component into the through hole of the substrate such that the third electronic component partially projects from the first main surface of the substrate;
forming a second sealing resin portion onto the second main surface of the substrate, into a gap provided between the through hole and the third electronic component, and in a vicinity of the third electronic component partially projecting from the first main surface of the substrate such that the second sealing resin portion covers the second electronic component and the third electronic component;
mounting the first electronic component onto the first main surface of the substrate; and
forming a first sealing resin portion onto the first main surface of the substrate such that the first sealing resin portion covers the first electronic component and surrounds the second sealing resin portion, which is provided in the vicinity of the third electronic component on the first main surface of the substrate,
wherein the first sealing resin portion and the second sealing resin portion are made of different types of resins, and
wherein the second sealing resin portion is partially exposed at a surface of the first sealing resin portion.

13. The method according to claim 12, further comprising:
forming a printed character onto a portion of the surface of the first sealing resin portion excluding a portion at which the second sealing resin portion is exposed.

14. The method according to claim 13,
wherein the forming a printed character is performed by laser irradiation.

15. A method of manufacturing an electronic module comprising, in the order listed below:
preparing a substrate that has a first main surface and a second main surface;
mounting the first electronic component onto the first main surface of the substrate;
forming a first sealing resin portion onto the first main surface of the substrate such that the first sealing resin portion covers the first electronic component;
forming at least one through hole that extends through the substrate and the first sealing resin portion;
mounting the second electronic component onto the second main surface of the substrate and placing the third electronic component into the through hole of the substrate; and
forming a second sealing resin portion onto the second main surface of the substrate and into the through hole such that the second sealing resin portion covers the second electronic component and the third electronic component,
wherein the first sealing resin portion and the second sealing resin portion are made of different types of resins, and
wherein the second sealing resin portion is partially exposed at a surface of the first sealing resin portion.

16. The method according to claim 15, further comprising:
forming a printed character onto a portion of the surface of the first sealing resin portion excluding a portion at which the second sealing resin portion is exposed.

* * * * *